(12) United States Patent
Maurer et al.

(10) Patent No.: US 7,394,320 B2  
(45) Date of Patent: Jul. 1, 2008

(54) PHASE-LOCKED LOOP AND METHOD FOR OPERATING A PHASE-LOCKED-LOOP

(75) Inventors: Linus Maurer, Linz (AT); Thomas Mayer, Linz (AT); Burkhard Neurauter, Linz (AT); Christian Wicpalek, Linz (AT)

(73) Assignee: Infineon Technologies AG, Munich (DE)

( * ) Notice: Subject to any disclaimer, the term of this patent is extended or adjusted under 35 U.S.C. 154(b) by 70 days.

(21) Appl. No.: 11/584,318

(22) Filed: Oct. 20, 2006

(65) Prior Publication Data

US 2007/0096833 A1    May 3, 2007

(51) Int. Cl.
    *H03L 7/00* (2006.01)
(52) U.S. Cl. .......................... 331/1 A; 331/16; 331/34; 331/177 R; 331/25; 327/156; 327/157; 375/376
(58) Field of Classification Search ............... 331/1 A, 331/34, 16, 25, 177 R; 327/156, 157; 375/376
See application file for complete search history.

(56) References Cited

U.S. PATENT DOCUMENTS

| | | | |
|---|---|---|---|
| 6,094,101 A | 7/2000 | Sander et al. | |
| 6,160,456 A | 12/2000 | Chang | |
| 6,219,394 B1 | 4/2001 | Sander | |
| 6,269,135 B1 | 7/2001 | Sander | |
| 6,658,748 B1 | 12/2003 | Leipold et al. | |
| 6,952,138 B2 | 10/2005 | Hagberg et al. | |
| 7,279,993 B2 * | 10/2007 | Bruno et al. ................. | 331/34 |
| 2002/0043992 A1 | 4/2002 | McCune, Jr. et al. | |
| 2002/0168043 A1 | 11/2002 | Sander | |
| 2003/0234693 A1 | 12/2003 | Staszewski et al. | |
| 2004/0057547 A1 * | 3/2004 | Henrickson ................. | 375/376 |
| 2004/0247041 A1 | 12/2004 | Biedka et al. | |

FOREIGN PATENT DOCUMENTS

| | | |
|---|---|---|
| EP | 1 255 355 A1 | 11/2002 |
| WO | WO 03/023951 A2 | 3/2003 |

OTHER PUBLICATIONS

"Delta-Sigma Modulators Using Frequency-Modulated Intermediate Values", Mats Høvin, Alf Olsen, Tor Sverre Lande and Chris Toumazou, IEEE Journal of Solid-State Circuits, vol. 32, No. 1, Jan. 1997, pp. 13-22.

"A Novel Multi-Bit Parallel Delta-Sigma FM-to-Digital Converter with 24-Bit Resolution", Dag T. Wisland, Mats E. Høvin and Tor S. Lande, ESSCIRC 2002, pp. 687-690.

* cited by examiner

*Primary Examiner*—Arnold Kinkead
(74) *Attorney, Agent, or Firm*—Eschweiler & Associates, LLC (57) ABSTRACT

A phase-locked loop suitable for mobile radio communications and a method for operating the same is disclosed. One embodiment of the phase-locked loop comprises an oscillator, a counter, a comparator, and a delay arrangement. The counter comprises a first input connected to the oscillator, a second input connected to a reference frequency terminal, and an output. An input of the comparator is connected to the output of the counter and an output of the comparator to the oscillator. The delay arrangement is connected between the oscillator and the first input of the counter or between the reference frequency terminal and the second input of the counter. The delay arrangement delays an input signal sent to an input of the delay arrangement, as a function of a sequence signal and makes a delayed signal available at an output of the delay arrangement.

20 Claims, 4 Drawing Sheets

PHASE-LOCKED LOOP AND METHOD FOR OPERATING A PHASE-LOCKED-LOOP

REFERENCE TO RELATED APPLICATIONS

This application claims the benefit of the priority date of German application DE 10 2005 050 621.6, filed on Oct. 21, 2005, the contents of which are herein incorporated by reference in their entirety.

FIELD OF THE INVENTION

The present invention relates to a phase-locked loop used for setting the oscillator frequency in a mobile radio communications device or in a stationary transmitting device, and to a method for operating the phase-locked loop.

BACKGROUND OF THE INVENTION

Phase-locked loops usually comprise an oscillator and a phase detector, to which an oscillator signal and a reference frequency signal are supplied. The phase detector compares a phase of the oscillator signal with a phase of the reference frequency signal. Periodically repeating signals can occur at an output of the phase detector especially in the case of digitally designed phase-locked loops which are in a phase-locked state. These signals can lead to undesirable signal components called "spurious emissions". These disturbances are often found near oscillator frequencies which are a whole-number multiple of the reference frequency.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention relates to a phase-locked loop, and to a method for operating the phase-locked loop used for setting the oscillator frequency in a mobile radio communications device or in a stationary transmitting device.

In one embodiment, a phase-locked loop is provided, and comprises a digitally controlled oscillator, a counter, a digital comparator and a delay arrangement. The delay arrangement is connected between the oscillator and the counter, or between a reference frequency terminal and an input of the counter. The delay arrangement is operable to delay an input signal as a function of a sequence signal, and is further operable to transmit a delayed signal from an output of the delay arrangement.

In another embodiment, a method for operating a phase-locked loop is provided, and comprises applying an oscillator signal and a reference frequency signal to a counter, and preparing a counter signal as a function of the oscillator signal and the reference frequency signal. The counter signal is then compared to a channel frequency word, and a setting of a digitally controlled oscillator is adjusted based on the comparison of the counter signal and channel frequency word. The oscillator signal or the reference frequency signal is then delayed on the way to the counter as a function of a sequence signal.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

One or more implementations of the present invention will now be described with reference to the attached drawings, wherein like reference numerals are used to refer to like elements throughout, and wherein the illustrated structures are not necessarily drawn to scale.

Figure 1A:
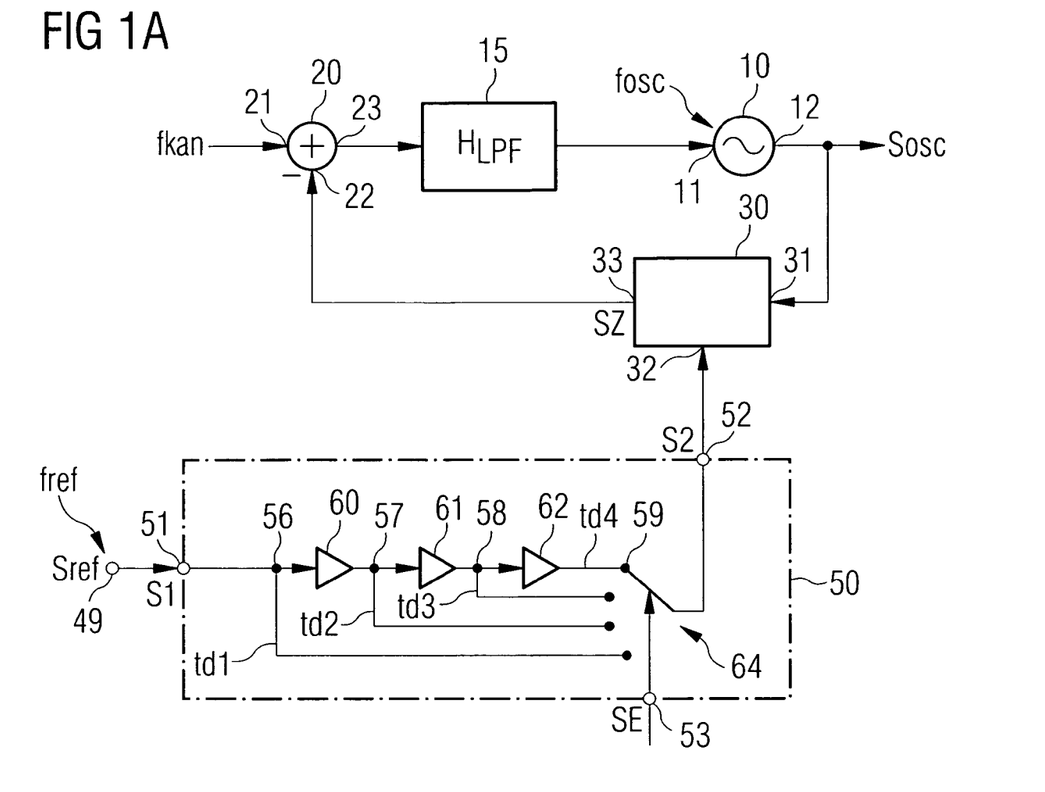
FIGS. 1A-1C are schematic diagrams of examples of phase-locked loops in accordance with the present invention.

FIG. 1A illustrates one embodiment of a phase-locked loop in accordance with the present invention. A comparator 20 is connected by an output 23 to an input of a loop filter 15. An output of the loop filter 15 is linked to an input 11 of an oscillator 10. A first input 31 of a counter 30 is connected to an output 12 of the oscillator 10.

A reference frequency terminal 49 is connected to an input 51 of a delay arrangement 50. The input 51 of the delay arrangement 50 forms a tap 56. A first delay component 60 is connected to the input 51 of the delay arrangement 50. At the output of the delay arrangement 50, the first delay component 60 is connected to a tap 57 and to a second delay component 61. The output of the second delay component 61 is connected to a tap 58 and to a third delay component 62. An output of the third delay component 62 forms a tap 59. The delay arrangement 50 also comprises a multiplexer 64, the input side of the delay arrangement may be connected to one of the taps 56-59 and may also connect the tap in question to an output 52 of the delay arrangement 50. The multiplexer 64 is connected to a control input 53 of the delay arrangement 50. The output 52 of the delay arrangement 50 is connected to a second input 32 of the counter 30. An output 33 of the counter 30 is connected to a second input 22 of the comparator 20.

An oscillator signal Sosc, which can be tapped at the output 12 of the oscillator 10, is applied to the first input 31 of the counter 30. At the reference frequency terminal 49, a reference frequency signal Sref at a reference frequency fref is applied to the phase-locked loop. The reference frequency signal Sref represents the input signal S1 to the delay arrangement 50. The delay components 60, 61, 62 are used to form various delayed signals from the input signal S1. A sequence signal SE is applied to the control input 53 of the delay arrangement 50. A delayed signal is selected by the multiplexer 64 based on the sequence signal SE and applied to the output 52 of the delay arrangement 50. It is therefore possible to tap a delayed signal S2 at the output 52 of the delay arrangement.

At its output, the counter provides a counter signal SZ, which is formed as a function of the delayed signal S2 and the oscillator signal Sosc. The counter signal SZ is applied to the second input 22 of the comparator 20. A channel frequency word fkan is present at a first input 21 of the comparator 20. A signal at the output 23 of the comparator 20 is filtered by the loop filter 15, sent as a filtered signal to the input 11 of the oscillator 10, and serves to set the frequency of the oscillator 10 to a frequency fosc at which the oscillator signal Sosc is transmitted.

An advantageous result is therefore obtained that the reference frequency signal Sref is delayed. Because of the different delay times, the counter signal SZ, which can be tapped, is prevented from causing undesirable signal components in the oscillator signal Sosc, which may also be advantageous.

The different delays of the reference frequency signal Sref result in different values of the counter signal SZ in the locked state of the phase-locked loop. Thus the advantage is obtained that the channel frequency words fkan that may be used and the oscillator frequencies fosc that are generated, can be close to whole-number multiples of the reference frequency fref. Without the delay arrangement, constant channel frequency words would generate spurious signal components near or in the useful signal frequency range or "in-band". Channel frequency words fkan which are farther away from a whole-number multiple of the reference frequency fref generate signal components with frequencies which may be far enough away from the in-band range that they can be suppressed sufficiently by the loop filter 15. As a result of the selection of the delay times td1, td2, td3, td4, which can be done randomly, pseudo-randomly, or in a predetermined manner, the same digital word is not always found at the output 33 of the counter 30. As a result, no patterns are created which could generate spurious signal components at the output of the phase-locked loop.

The different delays of the reference frequency signal Sref lead to the advantageous result that the channel frequency words fkan that may be used and the oscillator frequencies fosc that may be generated can correspond exactly to a whole-number multiple of the reference frequency. A counter in a phase-locked loop without the delay arrangement 50 may not immediately detect a slight change in the oscillator frequency fosc. If such a change occurs, the digital value for the frequency in question may not be correct. The signal at the input 11 of the oscillator 10 can thus remain constant even if there is a change in the transmitted oscillator frequency fosc. As a result of the different delays of the edges of the reference signal Sref, however, a different digital word is always being generated at the output 33 of the counter 30. As a result, even small changes in the oscillator frequency fosc can be detected.

As a result of the delay of the edges of the reference signal Sref, a phase deviation which remains constant on average can occur. This deviation does not represent a problem for the phase-locked loop, however, because the relative change in phase is not altered.

Figure 1B:
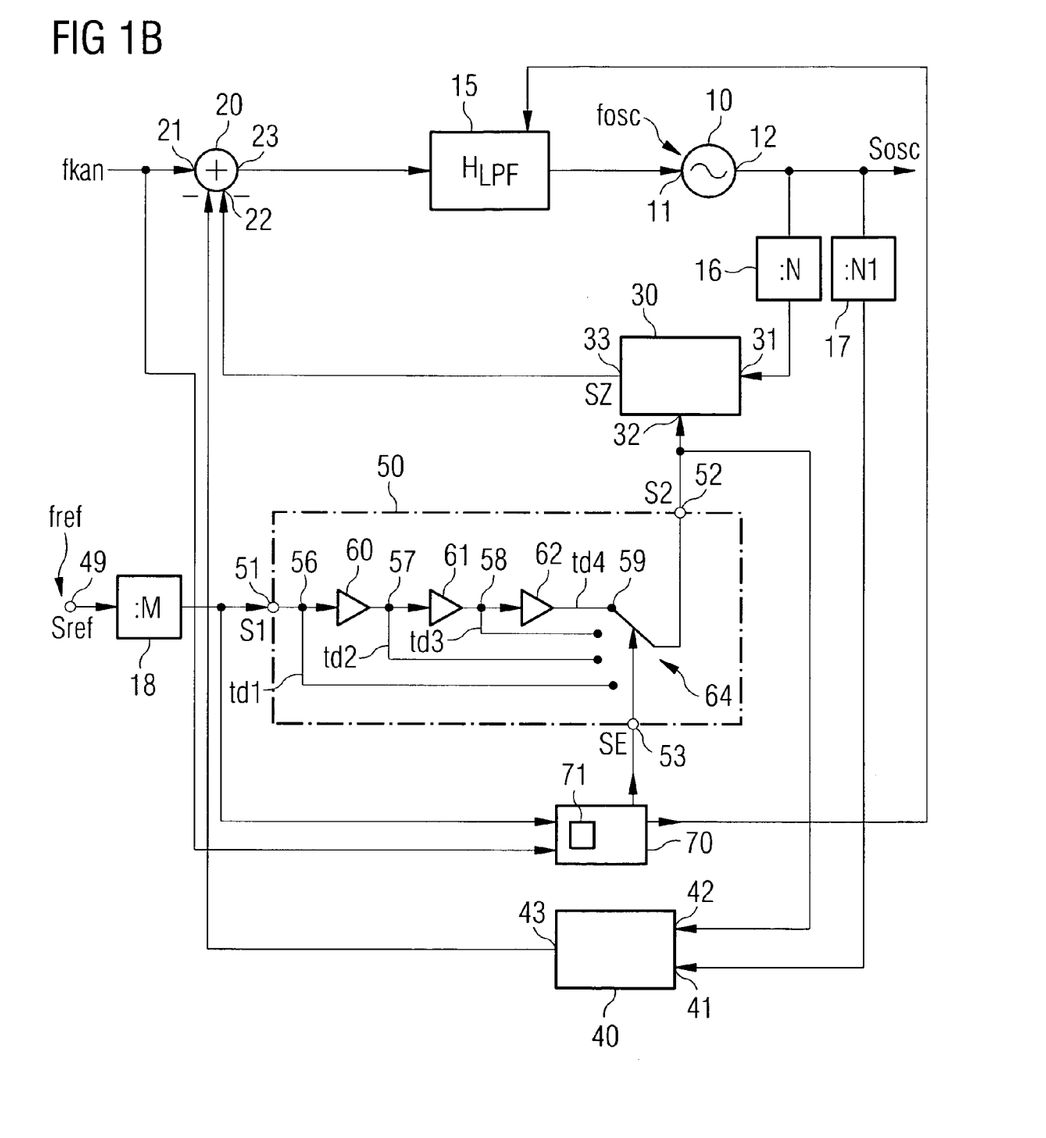

FIG. 1B shows an elaboration of the phase-locked loop of FIG. 1A. In addition to the elements described in FIG. 1A, a first frequency divider (N) 16 may be inserted between the output 12 of the oscillator 10 and the first input 31 of the counter 30. A second frequency divider (N1) 17 may be inserted between the output 12 of the oscillator 10 and a first input 41 of an additional counter 40.

A third frequency divider (M) 18 is connected between the reference frequency terminal 49 and the input 51 of the delay arrangement 50. The output 52 of the delay arrangement 50 is connected to the second input 42 of the additional counter 40. The additional counter 40 is connected at its output 43 to another input of the comparator 20.

An input of the sequence generator 70 is connected to the input 51 of the delay arrangement 50. The sequence generator 70 has another input, to which the channel frequency word fkan may be sent, and a memory table 71, for example. Another output of the sequence generator 70 is connected to the loop filter 15.

By means of the first frequency divider 16, the oscillator frequency fosc can be divided by a divisor N. In addition, the oscillator frequency fosc can be divided by means of the second frequency divider 17, which has a frequency divider with the divisor N1. The first of the two divided signals is sent to the input 31 of the counter 30, and the second is sent to the input 41 of the counter 40.

The reference frequency fref is divided by the third frequency divider 18, which has a divisor M. Thus the divided reference frequency signal is compared with differently divided oscillator signals. The signals present at the outputs 33 and 43 of the counters 30 and 40, respectively, are both sent to the comparator 20.

The connection between the input 51 of the delay arrangement 50 and the sequence generator 70 is used to trigger the multiplexer 64.

Using the connection between the sequence generator 70 and the loop filter 15, the loop filter 15 can be adjusted in such a way that it forms a mean value over a first number L of delay times, subsequently, the number the sequence signal SE repeats.

The channel frequency word fkan is sent to the sequence generator 70, so that the sequence generator 70 selects the delay times td1, td2, td3, td4 as a function of the adjustable oscillator frequency fosc and sets up the sequence signal SE according to which the multiplexer 64 will tap a selection of the taps 56-59. The memory table 71 contains various predetermined patterns of sequences of values for the sequence signal SE. The sequence generator 70 takes the sequence of values for the sequence signal SE, the sequence being predetermined for the channel frequency word in question from the memory table 71.

The counter 30 and the comparator 20 may thus be designed advantageously for a lower frequency range than the oscillator frequency fosc of the oscillator signal Sosc. Advantageously, the loop filter 15 may be adjusted to the period of the counter signal SZ.

Figure 1C:
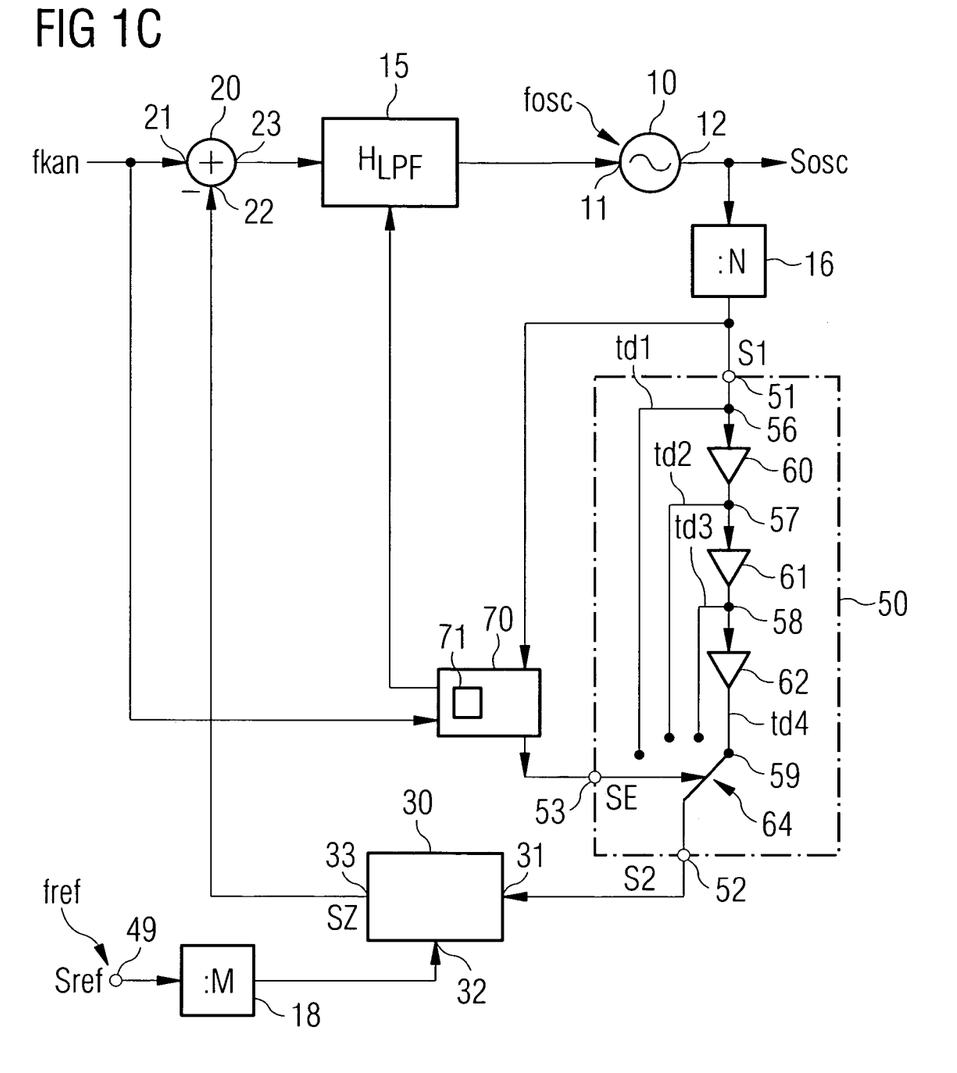

FIG. 1C illustrates another exemplary embodiment of a phase-locked loop in accordance with the present invention, which represents an elaboration of the phase-locked loop in accordance with FIG. 1A. In the phase-locked loop according to FIG. 1C, the delay arrangement 50 is not installed between the reference frequency terminal 49 and the second input 32 of the counter 30 as it may be in the phase-locked loop according to FIG. 1A. In the phase-locked loop according to FIG. 1C, the delay arrangement 50 may be inserted between the output 12 of the oscillator 10 and the first input 31 of the counter 30. In addition, a frequency divider 16 may be inserted between the output 12 of the oscillator 10 and the input 51 of the delay arrangement 50. Another frequency divider 18 may be connected between the reference frequency terminal 49 and the second input 32 of the counter 30.

The sequence generator 70 may be connected on the input side to the input 51 of the delay arrangement 50. On the output side, the sequence generator 70 may be connected to another input of the loop filter 15. The sequence generator 70 may contain, for example, a memory table 71.

The channel frequency word fkan may be applied to the input side of the sequence generator 70. Thus the sequence generator 70 may be used to set-up the sequence signal SE as a function of the channel frequency word fkan in such a way that the delay components 60, 61, 62 are suitably selected. The sequence generator 70 may take the sequence of values for the sequence signal SE, the sequence being predetermined for the channel frequency word in question from the memory table 71, for example.

The connection between the input 51 of the delay arrangement 50 and the sequence generator 70 is used to indicate that the sequence signal SE may be transmitted in phase with the input signal S1 of the delay arrangement 50.

It may be advantageous to use the frequency divider 16 and the additional frequency divider 18 to divide the oscillator frequency fosc and the reference frequency fref.

Because the sequence generator 70 may be connected to the loop filter 15, an average value can be advantageously established in the sequence generator 15 over the first number L of selected delay times. Sending or applying the channel frequency word fkan to the sequence generator 70 makes it possible for suitable delay components to be selected.

Figure 2:
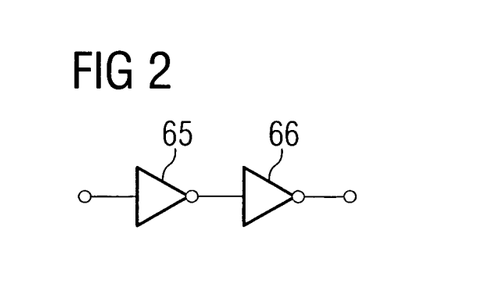
FIG. 2 is a schematic diagram of an exemplary embodiment of a delay component of the delay arrangement of FIGS. 1A-1C.

FIG. 2 shows an exemplary embodiment of a delay component which can be used as a delay component 60, 61, or 62 in the delay arrangement 50 according to FIGS. 1A-1C. The delay component according to FIG. 2 has two series-connected inverters 65, 66.

Figure 3:
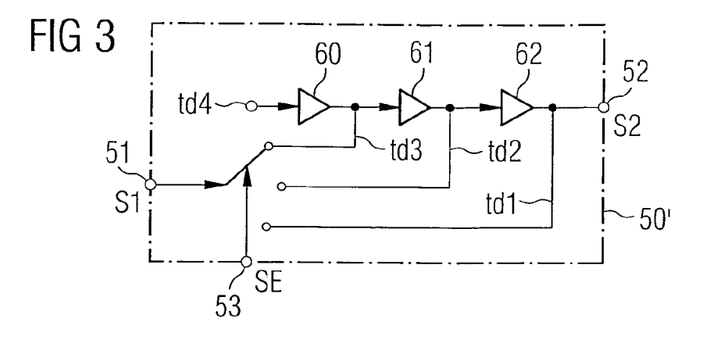
FIG. 3 is a schematic diagram of an alternative embodiment of a delay arrangement.

FIG. 3 shows an alternative exemplary embodiment of a delay arrangement 50', which may be used in the phase-locked loops according to FIGS. 1A-1C in place of the delay arrangement 50. The delay arrangement 50' comprises the first, the second, and the third delay components 60, 61, 62. The three delay components 60, 61, 62 are connected in series and may be arranged as shown by way of example in FIG. 2. The output of the third delay component 62 is connected to the output 52 of the delay arrangement 50'. The output 52 of the delay arrangement 50', the two nodes between the delay components 60, 61, 62, and an input of the first delay component 60 form taps for the multiplexer 64. The multiplexer 64 is connected by its additional terminal to the input 51 of the delay arrangement 50'.

It is therefore advantageous that four delay times td, td2, td3, td4, can be selected, wherein the delay time td1 has an approximate value of 0.

Figure 4:
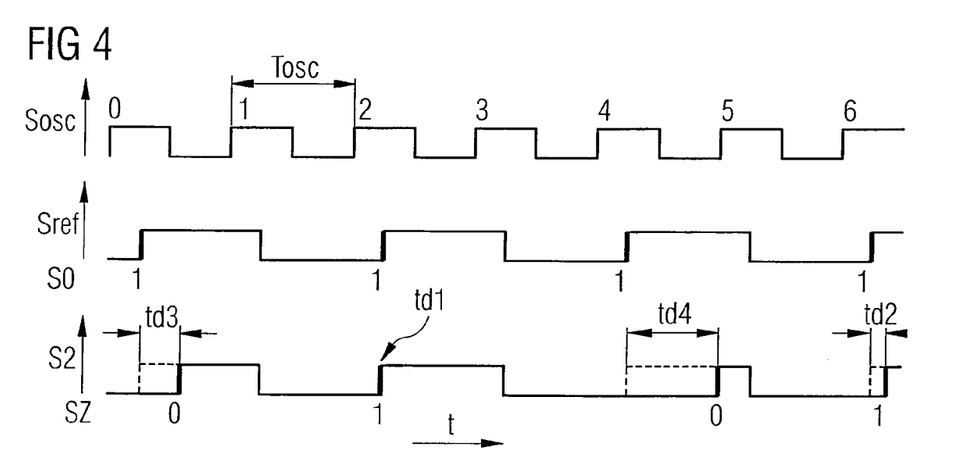
FIG. 4 is a timing diagram of an exemplary waveform of the phase-locked loops of FIGS. 1A-1C used in accordance with the invention.

FIG. 4 illustrates by way of example the oscillator signal Sosc, the reference frequency signal Sref, the digital values of a counter signal SZ0 without delay times, the delayed signal S2, and the digital values of the counter signal SZ as a function of time t.

Six periods of the oscillator signal Sosc are shown. The reference frequency signal Sref has a period which is twice as long as that of the oscillator signal Sosc.

When a positive edge of the reference frequency signal Sref arrives, the counter 30 compares the values of the oscillator signal Sosc with the values of the reference frequency signal Sref and produces at its output 33 the counter signal SZ0 with a value of 1, because the delay arrangement 50 is not actively producing any delay. This regularly recurring value of 1 can lead to undesirable signal components. In addition, if there is a slight drift of the phase position between the oscillator signal Sosc and the reference frequency signal Sref, changes may be found in the counter signal SZ only after a relatively long time.

The delayed signal S2 shows four different delay times. The delay time td3, which occurs first, is shorter than half of the period Tosc of the oscillator signal SZ, and the delay time td1, which occurs second, has a value of 0. The delay time td4, occurring third, is longer than half of the period Tosc of the oscillator signal Sosc, and the delay time td2, occurring fourth, is again shorter than half of the period Tosc of the oscillator signal Sosc. The sequence signal SE repeats after four values and has the sequence 3, 1, 4, 2. Thus the values 0, 1, 0, and 1 occur serially as the counter signals SZ. The rising edge of the reference frequency signal Sref is delayed, whereas the falling edge remains unchanged.

The value of the counter signal SZ may be thus "jittered" by the delay arrangement 50, so that a constant counter signal SZ is not produced and thus a constant signal does not appear at the output 23 of the comparator 20.

Figure 5:
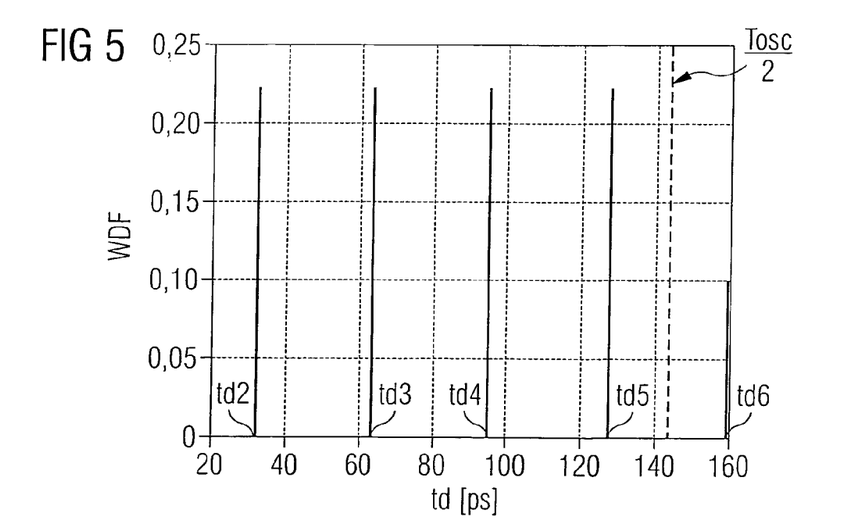
FIG. 5 is a plot of an example of a probability density function of the phase-locked loops of FIGS. 1A-1C in accordance with the present invention.

FIG. 5 illustrates by way of example a probability density function WDF, which indicates the frequencies at which various delay times occur in one of the possible embodiments. The durations of the various delay times are plotted in picoseconds on the x-axis. The values of the probability density function for the delay times td2, td3, td4, td5, and td6 are plotted on the y-axis.

In the probability density function WDF illustrated here by way of example for a 3.5 GHz channel, the four shorter delay times occur with the same frequency. The probability density function WDF has a smaller value for the delay time td6. The longest delay time td6 is less than one period Tosc of the oscillator signal Sosc but greater than half of the period Tosc.

Because of the smaller value for the probability density function WDF at the delay time td6, an advantage is obtained wherein the average value of the length of the two longest delay times td5 and td6 corresponds to half the period Tosc of the oscillator signal Sosc, which has the oscillator frequency fosc.

Therefore, an exemplary sequence may be 2, 4, 6, 3, 5, 2, 4, 3, 5. The same probability density function WDF, however, may also be achieved alternatively with a sequence which is twice as long or three times as long, for example.

In one embodiment, the phase-locked loop comprises a digitally controlled oscillator, a counter, a digital comparator, and a delay arrangement. An output of the oscillator is connected to a first input of a counter. A second input of the counter is connected to a reference frequency terminal. The comparator has a first input, a second input, and an output. The second input of the comparator is connected to an output of the counter. The output of the comparator is connected to an input of the oscillator. The delay arrangement may be inserted either between the output of the oscillator and the first input of the counter or between the reference frequency terminal and the second input of the counter. Thus, in both cases, a controlled delay is provided at an input of the counter.

At the output of the counter, a counter signal can be tapped, which is sent to the second input of the comparator. A signal formed by the comparator is sent to the oscillator to adjust the setting of the oscillator. At the output of the oscillator, an oscillator signal can be tapped, which is sent to the first input of the counter. At the reference frequency terminal, a reference frequency signal is supplied to the phase-locked loop; this signal is sent to the second input of the counter. One of the two lines leading to the inputs of the counter includes a delay arrangement. The reference frequency signal or the oscillator signal can be applied as an input signal to an input of the delay arrangement, and a sequence signal may be applied to its control input. Thus either the reference frequency signal or the oscillator signal may be delayed by the delay arrangement as a function of the sequence signal.

It also may be advantageous for one of the two input signals of the counter to be delayed under the control of the sequence signal in such a way that, even if the phase-locked loop is in a locked state, a uniformly repeating counter signal is not present at the output of the counter. In particular, a constant counter signal is not present there. As a result, the advantage may be obtained that spurious emissions caused by a counter signal with a short period may be avoided.

In one embodiment of the invention, the oscillator comprises a digitally controlled oscillator.

In an elaboration, the delay arrangement is designed in such a way that it has at least two predetermined delay times, which can be selected and used to delay the input signal. In one embodiment of this elaboration, one of the at least two predetermined delay times has a value of 0.

In a listing of the values of the delay times, in which the delay times are arranged in order of their values, the difference between the second-shortest delay time and the shortest delay time can be approximately equal to the difference between an n-th delay time and a (n−1)th delay time. It is possible for n to be a whole number, and it may have any value between 2 and the number of delay times.

In another elaboration, the delay arrangement comprises at least one delay component. The at least one delay component has a tap on the output side.

In one embodiment of the elaboration of the present invention, the first delay component is connected to the input of the delay arrangement. Additional delay components are connected in series with each other and connected to an output of the first delay component. These delay components can be realized as a delay chain. The delay arrangement may have a multiplexer, which is connected on the input side to the taps at the outputs of the delay components and on the output side to the output of the delay arrangement. The multiplexer may therefore serve to connect the minimum of one tap or the input of the delay arrangement to the output of the delay arrangement. The multiplexer may be controlled by the sequence signal.

In another embodiment of the elaboration, a chain of delay components is connected on the output side to the output of the delay arrangement. In this embodiment, the multiplexer connects the input of the delay arrangement to one of the inputs of the delay components of the delay chain or to the output of the delay arrangement.

In one embodiment, a delay component can comprise two inverters or some other even number of inverters. In another embodiment, the delay component can have two series-connected NOR gates or two series-connected NAND gates. Alternatively, the delay component may comprise a flip-flop.

In one embodiment, the multiplexer is realized by several switches, which are designed so that each one connects one of the taps to an output of the multiplexer. Each of the switches may comprise a metal-oxide semiconductor field-effect transistor.

In another elaboration of the present invention, the phase-locked loop comprises a sequence generator, which is connected on the output side to an additional input of the delay arrangement. The sequence generator is set up to provide the sequence signal. In one embodiment, the sequence generator is designed so that the sequence signal repeats after a first number L of values.

In one embodiment, the delay arrangement can have a plurality of values for the delay times, so that the phase-locked loop can be used advantageously for different oscillator frequencies.

In a first embodiment, the sequence generator is set up in such a way that the only values for the delay time which can be selected by means of the sequence signal are values which are less than or equal to half the period of the oscillator signal.

In a second embodiment, the sequence generator is designed so that the sequence signal can be used to select values for the delay time which are less than or equal to half the period of the oscillator signal and to select a value which is greater than half of the period of the oscillator signal.

In an elaboration of the first embodiment, the sequence generator is set up to generate the sequence signal in such a way that the delay times occur at approximately the same rates.

In an elaboration of the second embodiment, the sequence generator is set up to generate the sequence signal in such a way that the values of the delay times which are less than or equal to the period of oscillator signal occur at approximately the same rates and the value which is greater than half the period of the oscillator signal occurs at a lower rate.

In one embodiment, the delay arrangement may be inserted between the output of the oscillator and the first input of the counter.

In another embodiment, the delay arrangement may be inserted between the reference frequency terminal and the second input of the counter. An advantage of this embodiment is that the delay components and the multiplexer in this embodiment require less power than delay components and a multiplexer connected between the output of the oscillator and the counter.

The counter may be used to accomplish the function of a phase detector in the phase-locked loop.

In one embodiment, the counter is designed to transmit information consisting of one bit from its output. The counter can thus be a one-bit counter. The counter can be designed so that it makes a counter signal with a word length of 1 bit available on the output side.

If the two signals at the first and second inputs of the counter are both "high" at a predetermined time, the one bit can assume the value "high". If one signal or both signals at the first and second inputs of the counter are "low" at the predetermined time, the bit can assume the value "low".

In another embodiment, an average value of the 1-bit information is correlated with a phase position between the oscillator signal and the reference frequency signal. This can be the case when the maximum value of the selectable delay time is less than half the period of the oscillator signal and the various values occur at the same rate. The smaller the time intervals between the values of the delay times, the more accurate the determination of the phase position.

A one-bit counter may comprise an AND gate. The one-bit counter may also comprise a flip-flop and an XOR gate.

In another embodiment, the counter is set up to generate a counter signal with a word length of at least two bits. One bit can contain information on the phase position, and the other bit can contain the last digit of the frequency value of the oscillator signal, that is, of the oscillator frequency. The larger the number of bits which the counter generates as the counter signal, the larger the number of additional digits of the oscillator frequency value which can be transmitted.

The counter for a word length of at least two bits can be designed as a synchronous counter and can be designed to count the positive edges of the oscillator signal. Alternatively, it may be designed to count the positive and negative edges of the oscillator signal.

The predetermined point at which the counter signal is determined may be the time at which the positive edge of the reference frequency signal appears.

The time at which the positive edge of the reference frequency signal appears at the second input of the counter may be delayed by the delay arrangement. The delayed signal can have the value "high" for a constant duration. This duration can correspond to half the reciprocal of the reference frequency. The time at which the negative edge appears at the second input of the counter may also be delayed by the selectable delay time. In this embodiment, the duty cycle is unaffected by the sequence signal.

Alternatively, the delay arrangement can be set up in such a way that the time at which the negative edge appears at the second input of the counter does not depend on the delay time. In this embodiment, the duty cycle is affected by the sequence signal.

In one embodiment, the counter has a reset function. In an elaboration, the counter has a holding circuit on the output side.

The comparator may comprise a digital comparator in another embodiment. A channel frequency word may be applied to the first input of the comparator. The comparator is designed to transmit comparison information from its output, this information being formed as a function of the channel frequency word and the counter signal.

In one embodiment, the phase-locked loop comprises a loop filter. The loop filter is connected on the input side to the comparator and on the output side to the oscillator. The loop filter may comprise a digital filter or a low-pass filter.

In an elaboration, the loop filter is set up to form an average value. In one embodiment, the loop filter is designed to form an average value of at least greater than the first number L of values of the signal present at its input. Thus the loop filter is set up to form an average value of at least greater than the period at which the sequence signal repeats.

In one embodiment, the first number L corresponds to the number of different delay times which can be selected by means of the sequence signal. This offers the advantage that the period of the sequence signal is greater than the period of the oscillator signal. As a result of the different delay times, spurious emissions at the output of the phase-locked loop are suppressed. The phase-locked loop is thus able to generate oscillator frequencies which are a multiple of the reference frequency. The phase-locked loop may also generate frequencies which are close to frequencies which are a multiple of the reference frequency without producing spurious emissions. At these frequencies, no spurious emissions which cannot be suppressed sufficiently by the loop filter can occur.

In an elaboration, the first number L is a whole-number multiple of the number of delay times which can be selected by means of the sequence signal.

In an elaboration, the loop filter is connected on the input side to another output of the sequence generator. This offers the advantage that the loop filter can be adjusted as a function of the first number L of values of the sequence signal or as a function of the periodicity of the sequence signal.

It may be advantageous for the sequence generator to have an input to which the sequence generator the channel frequency word can be sent. It may also be advantageous for the sequence generator to be set up to select the delay times as a function of the channel frequency word and/or to determine the rate at which the delay times occur in the sequence signal. For this purpose, it is possible, for example, to provide a memory table, which contains appropriate signal patterns for the sequence signal.

In an elaboration, the phase-locked loop comprises a frequency divider, which is connected between the oscillator and the first input of the counter. In an alternative elaboration, the phase-locked loop comprises a frequency divider which is connected between the reference frequency terminal and the second input of the sequence counter. The frequency divider may be situated either in front of, or behind the delay arrangement.

In one embodiment, a phase-locked loop comprises a digitally controlled oscillator, downline from which a counter is connected, and a digital comparator, which is in turn downline from the counter. The comparator is connected on the output side to an input of the oscillator. In addition, the phase-locked loop has a delay unit, which may be inserted between the oscillator and a first input of the counter or between a reference frequency terminal and a second input of the counter. The delay arrangement is set up to delay the signals as a function of a sequence signal.

In an elaboration of this present embodiment, the phase-locked loop comprises a sequence generator. The sequence generator is connected on the output side to an input of the delay arrangement. The sequence generator is designed so that a sequence signal can be tapped at its output, namely, a sequence signal which repeats after a first number L of values.

The phase-locked loop may be used in a device for mobile radio communications to set the oscillator frequency and to modulate transmission data. Alternatively, the phase-locked loop may be used in a stationary transmitting device to set the oscillator frequency and to modulate transmission data. In both alternatives, the phase-locked loop may be used in the methods known by the names Universal Mobile Tele Communications System, abbreviated UMTS; Global System for Mobile Communications, abbreviated GSM; Enhanced Data rates over GSM Evolution, abbreviated EDGE; General Packet Radio Service, abbreviated GPRS; and Code-Division Multiple-Access 2000 (IS 95), abbreviated CDMA2000 (IS 95).

In one embodiment, a method for operating a phase-locked loop comprises the following steps: An oscillator signal and a reference frequency signal are sent to a counter. The counter generates a counter signal as a function of the oscillator signal and the reference frequency signal. The counter signal and a channel frequency word are compared. An oscillator is adjusted as a function of the result of the comparison. The oscillator signal or the reference frequency signal is delayed on its way to the counter as a function of a sequence signal.

The advantage is thus obtained that either the reference frequency signal or the oscillator signal is delayed in such a way that, even if the phase-locked loop is in a locked state, a signal at the output of the counter will not generate any spurious emissions at the output of the phase-locked loop.

In an elaboration, one of at least two predetermined delay times is selected by the sequence signal and used to delay the reference signal or the oscillator signal.

In another elaboration, the sequence signal repeats after a first number L of values of the sequence signal.

In one embodiment, spurious emissions in the range of the oscillator frequency caused by the counter are reduced.

In another embodiment, the phase-locked loop has the ability to generate an oscillator frequency which is a whole-number multiple of the reference frequency or is close to a whole-number multiple of the reference frequency.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

What is claimed is:

1. A phase-locked loop suitable for mobile communications, comprising:
    a digitally controlled oscillator, having an oscillator signal at an output thereof;
    a counter, comprising a first input connected to the output of the oscillator; a second input, which is connected to a reference frequency terminal and to which a reference frequency signal can be sent; and an output from which a counter signal can be transmitted;
    a digital comparator, comprising a first input; a second input, which is connected to the output of the counter; and an output, to which the input side of the oscillator is connected; and
    a delay arrangement,
        connected between the oscillator and the first input of the counter or between the reference frequency terminal and the second input of the counter,
        wherein the delay arrangement is operable to delay an input signal as a function of a sequence signal, the input signal being sent to an input of the delay arrangement, and
        wherein the delay arrangement is operable to transmit a delayed signal from an output of the delay arrangement.

2. The phase-locked loop of claim 1, wherein the delay arrangement is operable to delay the input signal by one of at least two predetermined delay times.

3. The phase-locked loop of claim 1, wherein the delay arrangement comprises at least one delay component having at least one tap on the output of the delay arrangement.

4. The phase-locked loop of claim 3, wherein the delay arrangement comprises a multiplexer that connects at least one tap or the input of the delay arrangement to the output of the delay arrangement and is controlled by the sequence signal.

5. The phase-locked loop of claim 1, wherein the phase-locked loop comprises a sequence generator operable to generate the sequence signal that repeats after a first number of values of the sequence signal, the sequence generator comprising an output connected to the delay arrangement.

6. The phase-locked loop of claim 2, wherein the sequence generator generates the sequence signal, wherein the maximum value of the delay time, selected by the sequence signal, is less than or equal to a period of the oscillator signal.

7. The phase-locked loop of claim 2, wherein the sequence generator generates the sequence signal, wherein the maximum value of the delay time selected by the sequence signal is approximately equal to half the period of the oscillator signal and that the selectable delay times occur at approximately the same rate.

8. The phase-locked loop of claim 1, wherein the delay arrangement is connected between the reference frequency terminal and the second input of the counter.

9. The phase-locked loop of claim 1, wherein the delay arrangement is connected between an output of the oscillator and the first input of the counter.

10. The phase-locked loop of claim 1, wherein the counter generates the counter signal with a word length of 1 bit.

11. The phase-locked loop of claim 1, wherein the counter generates the counter signal with a word length of at least two bits.

12. The phase-locked loop of claim 1, wherein a channel frequency word is sent to the first input of the comparator, and the comparator makes comparison information available at the output of the comparator as a function of the channel frequency word and the counter signal.

13. The phase-locked loop of claim 1, wherein the phase-locked loop comprises a digital loop filter connected between the comparator and the oscillator.

14. The phase-locked loop of claim 1, wherein the phase-locked loop comprises a frequency divider connected between the oscillator and the first input of the counter or between the reference frequency terminal and the second input of the counter, or both.

15. A phase-locked loop comprising a digitally controlled oscillator, a downline counter, and a downline digital comparator having an output connected to an input of the oscillator, and a delay arrangement connected between the oscillator and a first input of the counter or between a reference frequency terminal and a second input of the counter, wherein the delay arrangement delays an input signal of the delay unit as a function of a sequence signal.

16. The phase-locked loop of claim 15, wherein the phase-locked loop comprises a sequence generator having an output connected to the delay arrangement, so that the sequence signal that repeats after a first number of values of the sequence signal, can be transmitted to the delay arrangement.

17. The phase-locked loop of claim 15, wherein the phase-locked loop is configured to set the oscillator frequency in a device for mobile radio communications or in a stationary transmitting device.

18. A method for operating a phase-locked loop, the method comprising:
    applying an oscillator signal and a reference frequency signal to a counter;
    preparing a counter signal as a function of the oscillator signal and the reference frequency signal, using the counter;
    comparing the counter signal with a channel frequency word; and
    adjusting a setting of a digitally controlled oscillator based on the comparison of the counter signal and channel frequency word;
    wherein the oscillator signal or the reference frequency signal is delayed on the way to the counter as a function of a sequence signal.

19. The method of claim 18, wherein the sequence signal comprises a successive selection of at least two predetermined delay times by which the sequence signal delays the reference frequency signal or the oscillator signal.

20. The method of claim 19, wherein the sequence signal comprises a predetermined sequence and a periodic transmission of the sequence of the sequence signal.

* * * * *

UNITED STATES PATENT AND TRADEMARK OFFICE
CERTIFICATE OF CORRECTION

| | |
|---|---|
| PATENT NO. | : 7,394,320 B2 |
| APPLICATION NO. | : 11/584318 |
| DATED | : July 1, 2008 |
| INVENTOR(S) | : Linus Maurer et al. |

Page 1 of 1

It is certified that error appears in the above-identified patent and that said Letters Patent is hereby corrected as shown below:

On the title page, insert item [30]:
--This Application claims priority to German application DE102005050621.6 filed October 21, 2005--

Signed and Sealed this

Twenty-ninth Day of September, 2009

David J. Kappos
*Director of the United States Patent and Trademark Office*